United States Patent
Descamps et al.

(10) Patent No.: US 6,865,256 B1
(45) Date of Patent: Mar. 8, 2005

(54) METHOD AND APPARATUS FOR DETERMINING PROPERTIES OF A TRANSMISSION CHANNEL

(75) Inventors: Luc François Descamps, Gerpinnes (BE); Thierry Christian Marie Doligez, Boissy l'Aillerie (FR); Patrick Duvaut, Pointoise (FR)

(73) Assignee: Alcatel, Paris (FR)

( * ) Notice: Subject to any disclaimer, the term of this patent is extended or adjusted under 35 U.S.C. 154(b) by 17 days.

(21) Appl. No.: 09/740,939

(22) Filed: Dec. 21, 2000
(Under 37 CFR 1.47)

(30) Foreign Application Priority Data

Dec. 21, 1999 (EP) .............................................. 99403245

(51) Int. Cl.[7] .......................... H04M 1/24; H04M 3/08; H04M 3/22
(52) U.S. Cl. .................. 379/1.04; 379/1.01; 379/22.02; 379/24; 379/27.03; 379/21; 324/533
(58) Field of Search ............................... 379/1.01, 1.04, 379/21, 22, 22.01, 22.03, 22.08, 24, 27.01, 27.02, 27.03, 27.08, 29.01, 29.02, 29.03, 30; 324/527, 532, 533, 534; 370/249; 375/224

(56) References Cited

U.S. PATENT DOCUMENTS

| | | | |
|---|---|---|---|
| 5,128,619 A | * | 7/1992 | Bjork et al. ................. 324/533 |
| 5,649,304 A | * | 7/1997 | Cabot ....................... 455/67.14 |
| 5,751,149 A | | 5/1998 | Oberg et al. |
| 6,026,145 A | * | 2/2000 | Bauer et al. .............. 379/26.01 |
| 6,177,801 B1 | * | 1/2001 | Chong ......................... 324/520 |
| 6,215,855 B1 | * | 4/2001 | Schneider ..................... 379/22 |
| 6,266,395 B1 | * | 7/2001 | Liu et al. .................. 379/27.01 |
| 6,292,468 B1 | * | 9/2001 | Sanderson ................... 370/241 |
| 6,292,539 B1 | * | 9/2001 | Eichen et al. ............... 379/1.04 |
| 6,349,130 B1 | * | 2/2002 | Posthuma et al. .......... 379/1.04 |
| 6,366,644 B1 | * | 4/2002 | Sisk et al. .................. 379/1.04 |
| 6,385,297 B2 | * | 5/2002 | Faulkner et al. ........... 379/1.04 |
| 6,466,649 B1 | * | 10/2002 | Walance et al. .......... 379/22.03 |

FOREIGN PATENT DOCUMENTS

| | | | |
|---|---|---|---|
| EP | 0 926 841 A2 | 6/1999 | |
| GB | 551818 | 3/1943 | |
| WO | WO 01/24482 | * 4/2001 | ............ H04M/1/24 |

* cited by examiner

Primary Examiner—Quoc Tran
(74) Attorney, Agent, or Firm—Sughrue Mion, PLLC

(57) ABSTRACT

The invention concerns a time domain reflectometry method for estimating properties of a transmission channel, for instance a channel for transmitting electric or acoustic signals. This method includes the steps of generating, at one end of the channel, a plurality of pulses (40, 42, 44) covering differency frequency bands, and processing the echoes provided by these pulses at the same end of the channel. The frequency bands of the generated pulses are preferably overlapping. The invention is particularly applicable to the testing of ADSL services.

26 Claims, 3 Drawing Sheets

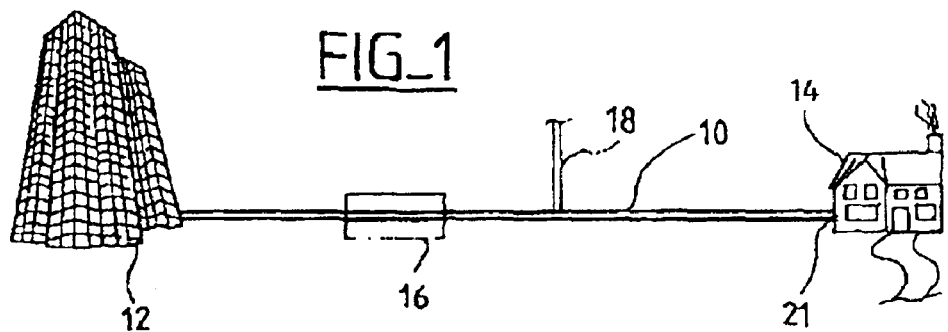
FIG_1
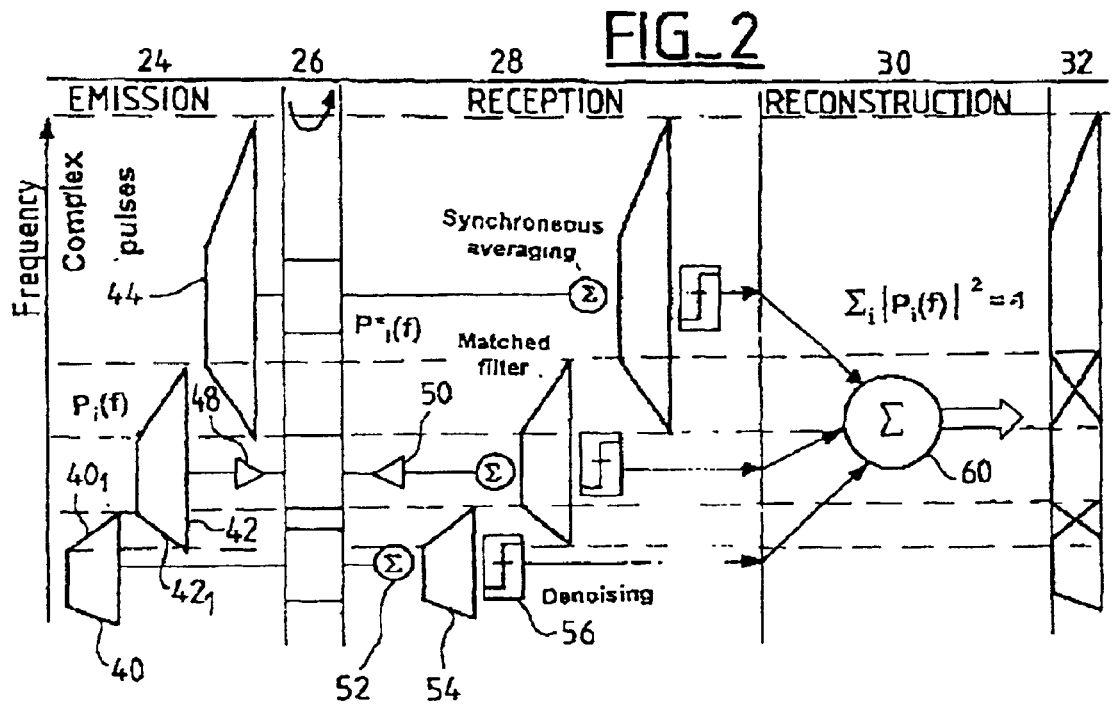
FIG_2
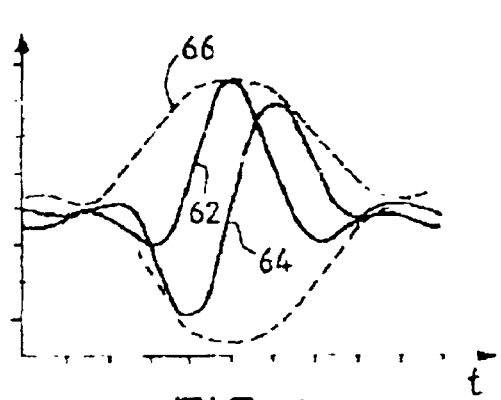
FIG_3a
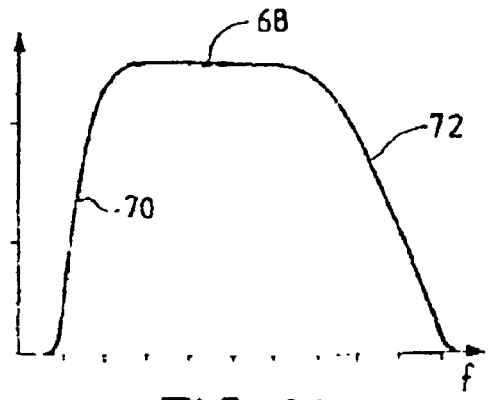
FIG_3b

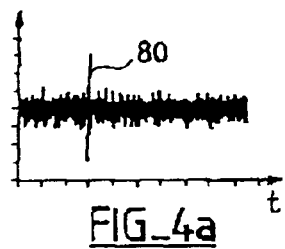
FIG_4a
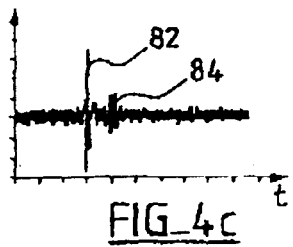
FIG_4c
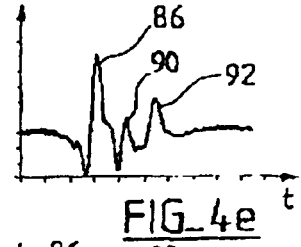
FIG_4e
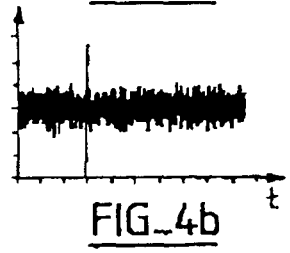
FIG_4b
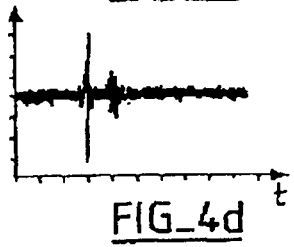
FIG_4d
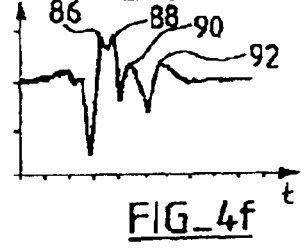
FIG_4f
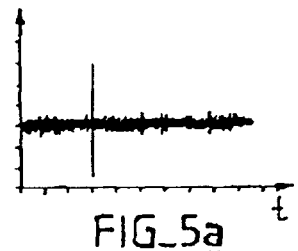
FIG_5a
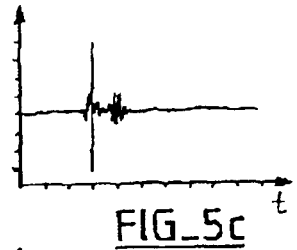
FIG_5c
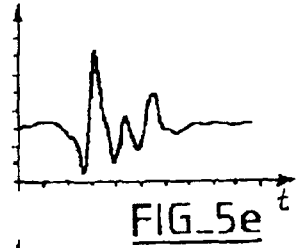
FIG_5e
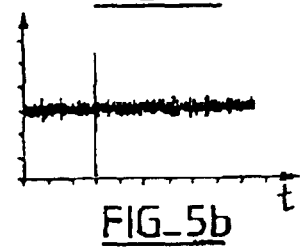
FIG_5b
FIG_5d
FIG_5f
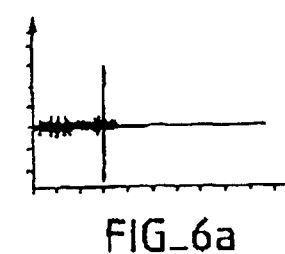
FIG_6a
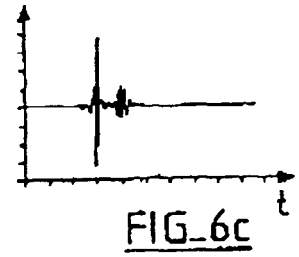
FIG_6c
FIG_6e
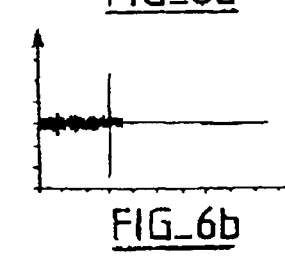
FIG_6b
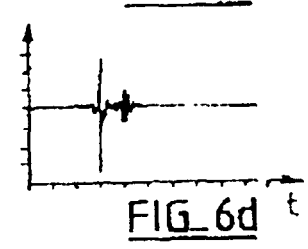
FIG_6d
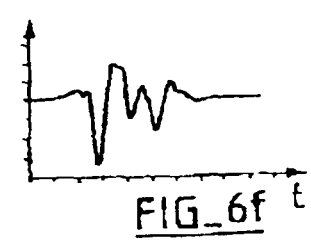
FIG_6f

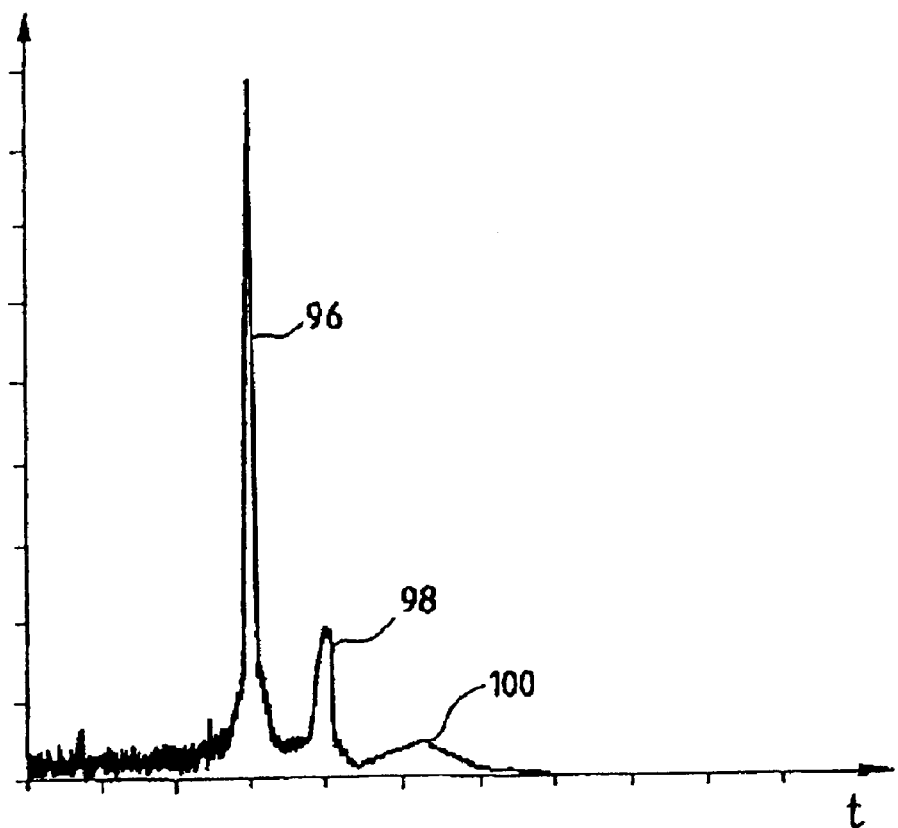
FIG_7
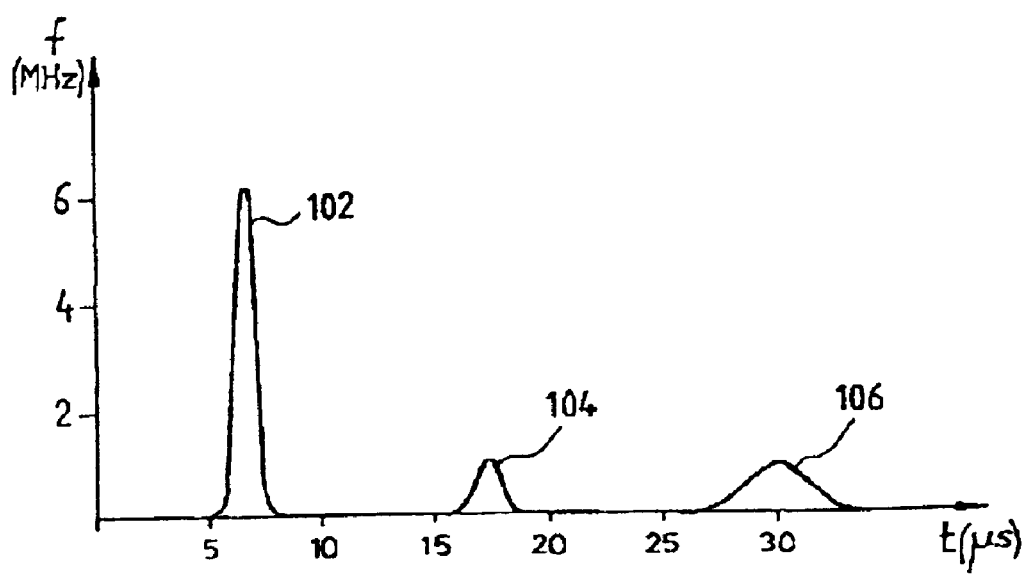
FIG_8

METHOD AND APPARATUS FOR DETERMINING PROPERTIES OF A TRANSMISSION CHANNEL

BACKGROUND OF THE INVENTION

The invention relates to a method and apparatus for determining properties of a transmission line or channel, for instance a channel for transmitting electric or acoustic signals. It concerns also a time domain reflectometry method and an equipment for implementing this method.

In the field of telecommunications, the density of transmitted information increases regularly. This increase is not always compatible with the existing equipment, more particularly with the existing transmission lines. In order to cope with this problem, several technologies are known, for instance ADSL which means "Asymmetric Digital Subscriber Line" (or other DSL services such as HDSL and VDSL). This technology provides the possibility to transmit, with ordinary telephone lines, high data rate from the network (a central office) to the subscriber and lower data rates from the subscriber to the network.

ADSL is adapted for distances, between a central station or office and the subscriber, which are comprised between 1.5 and 6 km. HDSL is adapted for distances greater than 6 km, and VDSL is adapted for distances comprised between 0.3 and 1.5 km.

In order to be able to comply with ADSL services, the telephone line must satisfy standards of quality which are not necessarily fulfilled by all telephone lines.

SUMMARY OF THE INVENTION

Before implementing ADSL services, it is therefore necessary to evaluate a priori the line quality at the lowest cost as possible and with the highest accuracy as possible. The present invention relates to a method and an apparatus which determine, from a central office, the transmission characteristics of a transmission line with a high signal to noise ratio and a high accuracy.

The invention thus contributes to the line qualification.

Up to now an a priori line qualification requires to make tests at both ends of the line. This means that one operator must be present at the central office and another operator at the subscriber's location. Although accurate, this a priori line testing is expensive.

The method according to the invention is characterized in that, for testing a line, use is made of time domain reflectometry wherein, at one end of the line, a plurality of pulses covering different bandwidths are transmitted in the line and the corresponding echoes are processed, more particularly filtered and reconstructed, at the same end, the echoes providing information about the whole length of the line.

Up to now, time domain reflectometry has been used only for detecting the first defect on a line. Time domain reflectometry is known to use only one pulse of narrow or wide frequency band at one time and the transmitted pulse provides only one echo. With the wide band "multifocal" (multi echoes) time domain reflectometry according to the invention, several echoes are provided which give information about the entire length of the line. In fact, with the invention, which makes use of pulses at different bandwidths, it is possible to optimize both the time accuracy and, with an appropriate filtering, the signal to noise ratio along the whole line, at any distance from the central office.

The plurality of pulses, called here "multifocality", allows to partially compensate for limited dynamics of the A/D (analog to digital) converters. In fact, with only one wide band pulse, it would be necessary to use a pulse of very high amplitude in comparison to the A/D converter ability.

In a preferred embodiment, the pulses are analytical complex pulses and contribute to a high signal to noise ratio.

Preferably the bandwidths of the transmitted pulses are overlapping and are such that the reconstructed echoes present a flat spectrum, i.e. a perfect line. In other words, without defects and without attenuation, the response has practically a constant amplitude over the whole useful frequency spectrum. In this way, the method provides directly the reflectometric impulse response of a line, for instance of a copper pair, generally a twisted pair.

As the pulses cover different bandwidths, in order to obtain this flat spectrum, it is necessary that, after reflection and processing, the modulus of the sum of the complex responses of the overlapping regions equals the modulus (for instance one) in the non-overlapping region.

In a preferred embodiment, the spectrum amplitude on one side of a band-width is decreasing according to a sine function and the overlapping part of the neighboring bandwidth is increasing according to a cosine function and the detected signal is the sum of squares of all components.

With this embodiment, after reflection, the first end of the first bandwidth will vary as $\sin^2$ and the overlapping adjoining beginning of the following bandwidth will vary as a $\cosin^2$. Therefore, in the overlapping region: $\sin^2+\cos^2=1$.

With this embodiment, it is also possible to provide a given gain (or attenuation) to each bandwidth in order that, for each of these bandwidths, the pulse be compatible with the power limitations imposed by standards. For instance, ADSL requests that the power be limited to −40 dbm/hertz ($10^{-4}$ mwatt/hertz) and VDSL requests a limitation to −60 dbm/hertz ($10^{-6}$ mwatt/hertz) for frequencies higher than 1 MHz.

Therefore, in order to obtain a flat spectrum, for each bandwidth, the transmitted pulse has a given amplification (or attenuation) and the received echo is provided with a complementary attenuation (or amplification).

The echoes provide in the time domain, and/or in the frequency domain, an information about the properties, generally the defects, of the line. Moreover, the positions in time of the echoes represent the locations of the defects.

In an embodiment, the frequency bandwidth and the amplitude of the low frequency pulses are selected according to the line attenuation and its compliancy in terms of egress. An egress compliant line is a line which does not disturb neighbouring services. In other word means are provided for selecting the frequency bandwidth and the amplitude of the low frequency pulses.

The time domain reflectometry method according to the invention is not limited to the estimation of the attenuation of telephone lines. More generally, this method may be used for estimating transmission channels which are dispersive, and subject to attenuation and noise.

These channels are not necessarily channels for transmitting electric signals; the signals may be of a different nature, for instance acoustic signals. The method provides the reflectometric impulse response with a good accuracy and a good signal-to-noise ratio at any distance.

In brief, the invention concerns a time domain reflectometry method for estimating properties of a transmission channel, for instance a channel for transmitting electric or acoustic signals, which is characterized in that it comprises the steps of generating, at one end of the channel, a plurality of pulses covering different frequency bands, and of processing the echoes provided by these pulses at the same end of the channel. The invention therefore determines a priori the reflectometric impulse response of this transmission line since it is to be noted that a spectrum over a wide bandwidth is equivalent to a Dirac function.

The invention relates also to a method for testing the properties, such as the attenuation, of telephone lines comprising copper pairs, for instance twisted pairs, between a central office and a subscriber, which is characterized in that it makes use of the time domain reflectometry.

The invention provides an apparatus for testing the properties, such as the attenuation, of telephone lines comprising copper pairs, for instance twisted pairs, between a central office and a subscriber, which is characterized in that it comprises time domain reflectometry means.

BRIEF DESCRIPTION OF THE DRAWINGS

Other features and advantages of the invention will appear with the following description of certain of its embodiments, this description being made in connection with the following drawings, wherein:

FIG. 1 represents the application of a method according to the invention to the estimation of defects of a telephone line for ADSL services, FIG. 2 is a schematic diagram showing an equipment according to the invention, this diagram representing also the operation of the equipment, i.e. the method according to the invention, FIGS. 3a and 3b show an example of pulses generated by the equipment represented on FIG. 2, and FIGS. 4a through 4f, FIGS. 5a through 5f, FIGS. 6a through 6f, and FIGS. 7 and 8 are diagrams showing signals at different locations on the receiving side of the equipment represented on FIG. 2.

DETAILED DESCRIPTION OF THE INVENTION

The time domain reflectometry method according to the invention was developed in order to test copper lines 10 between a central office 12 of a telephone operator and subscribers 14. The goal of the test is to check whether the copper pair 10 is able to comply with ADSL services, i.e. whether its attenuation is inferior to a maximum attenuation imposed by standards. Moreover, this method provides the possibility to localize defects of the line 10.

In the schematic example shown on FIG. 1, a part 16 of the line 10 which is relatively dose to the central office or station 12 is subject to humidity; after this defect 16, in the direction from the office 12 to the subscriber 14, the line presents a defect 18 corresponding to a bridge tap, i.e. a derivation.

In the preferred embodiment of the method according to the invention, a set of pulses are simultaneously or sequentially generated (sequentially in the example) at the central station 12, each pulse covering a given bandwidth and the bandwidths of all the pulses are overlapping. The whole bandwidth formed by these pulses is wide, for instance, from 20 kHz to 6 MHz.

The set of pulses generated sequentially are transmitted from the office 12 on the line 10 and they are reflected by the defects 16, 18, as well as by the line end 21, i.e. by subscriber 14. In fact, it is known that a telephone set which is not in operation is a pure reflector.

The reflections or echoes are detected and processed at the central office 12 according to the equipment and method represented on FIGS. 2–8 and these processed echoes provide information about the line 10 and its defects.

In the simplified example represented on FIG. 2, the vertical line 22 on the left represents the frequency and the diagram is, in the horizontal direction, separated in five zones 24, 26, 28, 30, and 32 from the left to the right. The zone 24 corresponds to the transmission of pulses at the central office 12. The zone 26 represents the path of the pulses from the central office 12 to the subscriber 14 and back from the subscriber 14 to the central office 12. The zone 28 represents the processing of the received echoes, each processing corresponding to a given band-width. The zone 30 represents the sum ot the echoes which are processed in zone 28 and the zone 32 represents the spectrum of the transmitted, filtered and reconstructed pulses.

In the simplified example, three pulses 40, 42, 44 are provided. The pulse 40 has a spectrum which covers the low frequencies, the pulse 42 has a spectrum which covers the medium frequencies and the pulse 44 has a spectrum which covers the high frequencies. For instance, the pulse 40 covers 12.5 kHz to 960 kHz, the pulse 42 covers 512 KHz to 2.6 MHz and the pulse 44 covers 1.65 MHz to 6.3 MHz. The frequency bands of these pulses are overlapping. More precisely, the higher part of the frequency band of pulse 40 overlaps with the lower part of the frequency band of pulse 42 and the higher part of the frequency band of the pulse 42 overlaps with the lower part of the frequency band of pulse 44.

Moreover, the overlapping portions of the spectra of the pulses are such that, after reflection, reception and processing, the amplitude of the added over-lapped parts equals the amplitude of the non-overlapping parts. In other words, after reception, the spectrum of all the pulses is practically flat, as shown on zone 32 of FIG. 2.

For instance, the higher part $40_1$ of the frequency band of pulse 40 varies as a sine function and the overlapping part of the lowest portion $42_1$ of the frequency band of pulse 42, varies as a cosine function. As in zone, or step, 30, as explained herein after, the squares of the amplitudes of the spectra are added, the overlapping regions $40_1$, $42_1$ provide after the final processing: $\sin^2+\cos^2=1$.

The method provides also, on the transmission side, a gain (amplification or attenuation) for each pulse. For the sake of simplicity of the drawing, only the amplification and attenuation for pulse 42 have been represented. To the pulse 42 corresponds a gain represented by an amplifier 48, and on the receiving side (zone 28), the inverse gain 50 is provided in order that the resulting spectra (zone 32) be flat as explained herein above.

Each gain may be different from one bandwidth to another bandwidth, in order to comply with the requirements of the standard which may impose different constraints on the admissible maximum power for different bandwidths.

On the receiving side, for each bandwidth, a processing is performed to drastically reduce the noise: a synchronous averaging 52, followed by a matched filtering 54 and a denoising 56. Each signal at the corresponding bandwidth, after having been processed by the synchronous averaging 52, the matched filtering 54 and the denoising 56, is submitted to a reconstruction step (zone 30) 60 which sums the outputs of the processing steps. Because of the matched filter properties, the summation of the outputs of the processing steps is equivalent in the frequency domain, to the following equation:

$$\sum_i |P_i(f)|^2 = 1,$$

where $P_i(f)$ is the transfer function for each pulse.

FIG. 3a shows the variation with time (in abscissa) of the pulse 40. The curve 62 corresponds to the real part of the pulse, the curve 64 represents the variation of the imaginary part, and the curve 66 represents the envelope of the pulse.

The diagram of FIG. 3b shows the spectrum of the pulses 62 and 64, i.e. the Fourier transform of said pulses. As shown, the spectrum, which extends from 20 kHz to 200 kHz presents a flat part 68, a raising edge 70 and a falling edge 72. As mentioned before, the falling edge has, for instance, the shape of a sine function.

The diagrams of FIG. 4 represent the signals obtained after synchronous averaging 52 and before matched filtering 54.

FIG. 4a represents the variation with time of the real part of the signal for the pulses 44 at high frequencies, and FIG. 4b represents the variation with time of the imaginary part for the signal at the output of a synchronous averaging corresponding to the same high frequency pulses 44.

The diagrams of FIG. 4c and FIG. 4d correspond, respectively, to the real and imaginary parts of the complex signal obtained after synchronous averaging for the medium frequency pulses and FIG. 4e and FIG. 4f are diagrams corresponding also to the real and imaginary parts of the signal obtained at the output of the synchronous averaging 52 for the low frequency pulses.

FIG. 4a and FIG. 4b show that, for high frequencies, the echoes present a pulse 80. This pulse corresponds to a defect 16 close to the central office 12, because the attenuation on the line increases sharply with the frequency and the distance.

For medium frequencies (FIG. 4c and FIG. 4d), the diagram shows two echoes 82 and 84 corresponding to defects 16 and 18 and, for low frequencies (FIG. 4e and FIG. 4f), the diagram shows several echoes corresponding to defects 16, 18, and to the line end 21. It is recalled that, in this example, the load coil defect 20 is not present.

The diagrams of FIG. 5 are similar to the diagrams of FIG. 4. but they represent the echoes obtained after the matched filtering 54. The matched filtering comprises a step of correlating the received pulse with the transmitted pulse. This matched filtering provides a further sharp decrease of the noise, as shown by comparison of the diagrams of FIG. 4a to FIG. 4f with the corresponding diagrams of FIGS. 5a to 5f.

A further reduction of noise, more particularly for the high frequency pulses is obtained with the denoising 56. This further noise suppression comprises a step of determining a threshold below which the values of signal and noise are set to zero, only the echoes which are above this threshold being taken into account.

The threshold is, in an example, determined by an estimation of the noise at the end (on the right of diagrams of FIG. 5) of the signals obtained after matched filtering. In fact, the ending time corresponds to the end of the line, at the subscriber's location, for which no signal can be detected in medium and high frequencies; therefore, the signal end corresponds, in practice, exclusively to noise for high and medium frequencies. The noise is estimated by the variance of the signal at said signal end and the threshold is determined by multiplying the square root of this variance by a predetermined factor, for instance 2. More precisely, the noise variance is estimated after the line end echo, i.e. on a noise alone segment.

It is to be noted that the denoising is limited to the signals which appear after the last echo. No denoising is performed on signals appearing before the last echo.

The result of the denoising appears on the diagrams of FIG. 6a to FIG. 6f which are similar to the diagrams of FIG. 4a to FIG. 4f.

FIG. 7 is a diagram showing the variation with time of the signal after the summing of the outputs of the processing step for the three frequency bands (output of adder 60).

This diagram shows that the time domain reflectometry method of the invention provides, in this example, three echoes 96, 98 and 100. The first echo corresponds mainly to defect 16, the second echo to defect 18 and the third to the line end 21.

On the diagram of FIG. 8, the abscissa is the time t and the ordinate is the frequency f. It can be seen that, to the three lines 96, 98, 100, correspond lines 102, 104 and 106. The line 102 extends on the whole frequency band, the line 104 corresponds to the medium frequencies and the last line 106 is limited to low frequencies.

Therefore, the diagrams obtained with FIG. 7 and FIG. 8 show that the method according to the invention provides, with only one measurement, information about the properties of the line and the defects, more particularly about the location of such defects.

More generally, the method according to the invention provides directly an estimation of the reflectometric impulse response of a line, with a good time accuracy and a high signal-to-noise ratio at any distance.

What is claimed is:

1. A time domain reflectometry method for determining properties of a transmission channel, comprising:
   generating, at one end of the channel, a plurality of pulses covering different frequency bands through time domain reflectometry, and
   processing, as received signals, the echoes provided by the plurality of pulses at said one end of the channel;
   wherein the generating is performed so that the frequency bands of adjacent ones of the plurality of pulses overlap.

2. A method according to claim 1, wherein the overlapping of the frequency bands is such that, after reflection and said processing, the frequency spectrum of the plurality of pulses is practically flat.

3. A method according to claim 1, further comprising:
   providing each of the plurality of pulses with a given amplification or attenuation, and
   providing pulses of the received signals with the corresponding attenuation or amplification.

4. A method according to claim 1, further comprising subjecting the received signals to a synchronous averaging.

5. A method according to claim 1, further comprising subjecting the received signals to a matched filtering.

6. A method according to claim 1, further comprising suppressing noise, in medium and high frequency pulses of the received signals, by
   estimating the noise for the part of the received signal after the channel end echo, and
   determining a threshold above which the received signals are taken into consideration.

7. A method according to claim 1, wherein the processing of the received signals is performed so that the received signals are processed in their own frequency bands, and then added.

8. A method according to claim 7, further comprising detecting the variation with time of one or more of:

the modulus of the received signals, and the frequency of the received signals.

9. A method according to claim 1, wherein the generating of the plurality of pulses is performed so as to generate complex analytical pulses.

10. A method according to claim 1, further comprising selecting the frequency bandwidth and the amplitude of low frequency pulses of the received signals according to the channel attenuation and its compliancy in terms of egress.

11. A method according to claim 1, wherein the plurality of pulses are generated sequentially or simultaneously.

12. A method according to claim 1, wherein at least one of said properties being determined comprises the locations of defects of the channel.

13. A method according to claim 1, wherein said transmission channel comprises a telephone line between a central office and a subscriber, and the processing of the received signals is performed at the central office.

14. An apparatus for testing the properties of transmission channels between a central office and a subscriber, comprising a time domain reflectometry test circuit, wherein said time reflectometry test circuit comprises:

a pulse generator generating a plurality of pulses, at one end of the line, covering different frequency bands through time domain reflectometry, and an echo processor processing the echoes provided by these pulses at the same end of the channel;

wherein the different frequency bands of adjacent ones of the pulses are overlapping.

15. An apparatus according to claim 14, wherein the different frequency bands are overlapping.

16. An apparatus according to claim 15, wherein said echo processor processes the reflected pulses such that the frequency spectrum is practically flat after reflection and processing.

17. An apparatus according to claim 14, wherein the pulse generator includes amplification or attenuation for each generated pulse, and said apparatus includes complementary attenuation or amplification for each received pulse.

18. An apparatus according to claim 14, further comprising a synchronous averager for the received signals.

19. An apparatus according to claim 14, further comprising a matched filter for the received signals.

20. An apparatus according to claim 14, further comprising amplification or attenuation for each generated pulse and complementary attenuation or amplification for each received pulse.

21. An apparatus according to claim 14, further comprising a processor processing the received signals for each frequency band and an adder adding the processed signals.

22. An apparatus according to claim 21, further comprising a detector detecting the modulus of the received signals and/or the variation with time of the frequency of the received signals.

23. An apparatus according to claim 14, further comprising a receiver receiving complex analytical pulses.

24. An apparatus according to claim 14, further comprising a selector selecting the frequency bandwidth and the amplitude of the low frequency pulses according to the line attenuation and its compliancy in terms of egress.

25. An apparatus according to claim 14 wherein said pulse generator generates the pulses sequentially or simultaneously.

26. An apparatus according to claim 14, wherein said transmission channels are telephone lines comprising copper pairs between a central office and a subscriber.

* * * * *